(12) United States Patent
Lim

(10) Patent No.: US 6,434,083 B2
(45) Date of Patent: Aug. 13, 2002

(54) SEMICONDUCTOR MEMORY DEVICE FOR IMPLEMENTING HIGH SPEED OPERATION OF DELAY LOCKED LOOP

(75) Inventor: Hyun-wook Lim, Sungnam (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/841,613

(22) Filed: Apr. 24, 2001

(30) Foreign Application Priority Data

May 6, 2000 (KR) ............................................ 00-24213

(51) Int. Cl.[7] ................................................. G11C 8/00
(52) U.S. Cl. ........................ 365/233; 365/194; 327/146; 327/147
(58) Field of Search ................................ 365/233, 194, 365/230.01; 327/146, 147

(56) References Cited

U.S. PATENT DOCUMENTS

| | | | |
|---|---|---|---|
| 5,307,381 A | 4/1994 | Ahuja ......................... | 375/107 |
| 5,712,884 A | 1/1998 | Jeong ......................... | 375/375 |
| 5,771,264 A | 6/1998 | Lane ........................... | 375/376 |
| 5,777,498 A | 7/1998 | Cometti et al. ............. | 327/156 |
| 5,963,069 A | 10/1999 | Jefferson et al. ........... | 327/158 |
| 6,002,732 A | * 12/1999 | Makino ....................... | 324/161 |
| 6,150,859 A | * 11/2000 | Park ............................ | 327/149 |
| 6,191,632 B1 | * 2/2001 | Iwata et al. ................. | 327/262 |

* cited by examiner

*Primary Examiner*—Hoai V. Ho
(74) *Attorney, Agent, or Firm*—Mills & Onello, LLP

(57) ABSTRACT

A semiconductor memory device for implementing high speed operation of a delay locked loop (DLL) generates internal clock signals synchronized with external clock signals. The semiconductor memory device includes a first input clock buffer for receiving a pair of external clock signals to generate a reference clock signal and a DLL which receives the reference clock signal and a feedback reference clock signal. The respective phases of the reference clock signal and the feedback reference clock signal are compared, and a pair of internal clock signals are generated. The semiconductor memory device further includes a first feedback clock buffer which receives the pair of internal signals and generates a first feedback clock signal; a second feedback clock buffer which receives the pair of internal signals and generates a second feedback clock signal, and a second input clock buffer which receives the first and second feedback clock signals and generates the feedback reference clock signal. The semiconductor memory device utilizes an input clock buffer which receives complementary first and second feedback clock signals, thereby allowing for high-speed operation of the input clock buffer and DLL.

7 Claims, 3 Drawing Sheets

SEMICONDUCTOR MEMORY DEVICE FOR IMPLEMENTING HIGH SPEED OPERATION OF DELAY LOCKED LOOP

BACKGROUND OF THE INVENTION

1. Field of the Invention

The present invention relates to a semiconductor memory device, and more particularly, to a semiconductor memory device for implementing high-speed operation of a delay locked loop that generates an output signal synchronized with an input signal.

2. Description of the Related Art

In widely used dual data synchronous dynamic random access memories (DDR SDRAMs) and Rambus DRAMs (RDRAMs), data is input to, or output from, a memory cell in synchronization with clock signals. The clock signals are input at a pin on the device and distributed to the entire device. A clock signal that arrives at a portion of the device that is a relatively long distance away from the input pin can be significantly delayed, as compared with a clock signal that arrives at a portion adjacent to the input pin. This delay makes it difficult to maintain synchronization between each portion of a DDR SDRAM or RDRAM. Thus, delay locked loops or phase locked loops are utilized to match the synchronization of clock signals. For example, delay locked loops are used to generate internal clock signals for performing data sampling at a valid data window for accurate data reception. Delay locked loops are further used to generate internal clock signals for synchronizing the edge of data to be transmitted with the edge of an external clock signal sent to a memory controller for ideal data transmission.

FIG. 1 is a block diagram showing a semiconductor memory device having a conventional delay locked loop. Referring to FIG. 1, in order to receive external clock signals CLK and CLKB and then generate internal clock signals ICLK synchronized with the received signals, a semiconductor memory device 100 includes input clock buffers 110 and 120, a delay locked loop (DLL) 140, output buffers 160 and 180. A first input clock buffer 110 receives the external clock signals CLK and CLKB to generate a reference clock signal REF, and a second input clock buffer 120 receives the external clock signal CLK and a feedback clock signal FDCLK to generate a feedback reference clock signal (FDREF). The DLL 140 compares the phase of the reference clock signal REF with the phase of the feedback reference clock signal FDREF and then delays the feedback reference clock signal FDREF by a predetermined time period depending on the comparison result. Then, the internal clock signals ICLK and ICLKB synchronized with the referenced clock signal REF are generated. Thus, the internal clock signal ICLK is set to lock the phase of the external clock signal CLK with the phase of the output data.

Thereafter, the internal clock signal ICLK is used as an actual clock signal for data reception and data transmission, as described above. For example, a first output buffer 160 transmits internal data DBi_F and DBi_S to an output pad DQ in response to the internal clock signal ICLK. Then, a second output buffer 180 having the same configuration as the first output buffer 160 is provided to generate the feedback clock signal FDCLK which delays the internal clock signal ICLK by;a predetermined time period. The feedback clock signal FDCLK is input to the second input clock buffer 120 together with the external clock signal CLK. The second input clock buffer 120 is comprised of a differential input buffer, as shown in FIG. 2. The differential input buffer serves to quickly sense a voltage difference between received two input signals to generate the result as an output signal, and it is primarily used in a semiconductor memory device which requires high speed operation.

However, the second input clock buffer 120 of FIG. 2 is limited in that it cannot perform a high speed operation which is characteristic of the differential input buffer. Since the two input signals, i.e., the external clock signal CLK and the feedback clock signal FDCLK are input to a differential input buffer with a delayed phase difference, a delay in sensing the voltage difference may occur compared to a complementary pair of input signals. This delay of the differential input buffer raises a problem in that the differential input buffer intended for a high-speed operation cannot perform its function properly. Furthermore, the delay is also reflected in phase locking, which is one of the primary operations of the DLL 140, thus preventing a high-speed operation of the DLL 140.

SUMMARY OF THE INVENTION

To solve the above problems, it is an objective of the present invention to provide a semiconductor memory device having a delay locked loop (DLL) which stably generates an output signal synchronized with an input signal at high speed.

Accordingly, to achieve the above objective, the present invention provides a semiconductor memory device for generating internal clock signals synchronized with external clock signals, which includes a first input clock buffer for receiving a pair of external clock signals to generate a reference clock signal, a DLL for receiving the reference clock signal and a feedback reference clock signal and phase-comparing those signals to generate a pair of internal clock signals, a first feedback clock buffer for receiving the pair of internal clock signals to generate a first feedback clock signal, a second feedback clock buffer for receiving the pair of internal clock signals to generate a second feedback clock signal, and a second input clock buffer for receiving the first and second feedback clock signals to generate the feedback reference clock signal.

Preferably, the first and second feedback clock signals are complementary. The first input clock buffer is a differential input buffer for sense amplifying a voltage level difference between the pair of external clock signals and generating the reference clock signal, while the second input clock buffer is a differential input buffer for sense amplifying a voltage level difference between the first and second feedback clock signals and generating the feedback reference clock signal. The first feedback clock buffer receives the pair of internal clock signals and generates the first feedback clock signal having the same phase as the internal clock signal, while the second feedback clock buffer receives the pair of internal clock signals and generates the second feedback clock signal having opposite phase to the internal clock signal.

The present invention employs an input clock buffer which receives complementary feedback clock signals to implement a high-speed operation of a DLL for generating internal clock signals which are synchronized with external clock signals. Accordingly, the present invention facilitates a high-speed operation of the input clock buffer, which is realized as a differential input buffer, and a DLL.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF PREFERRED EMBODIMENTS

Figure 1:
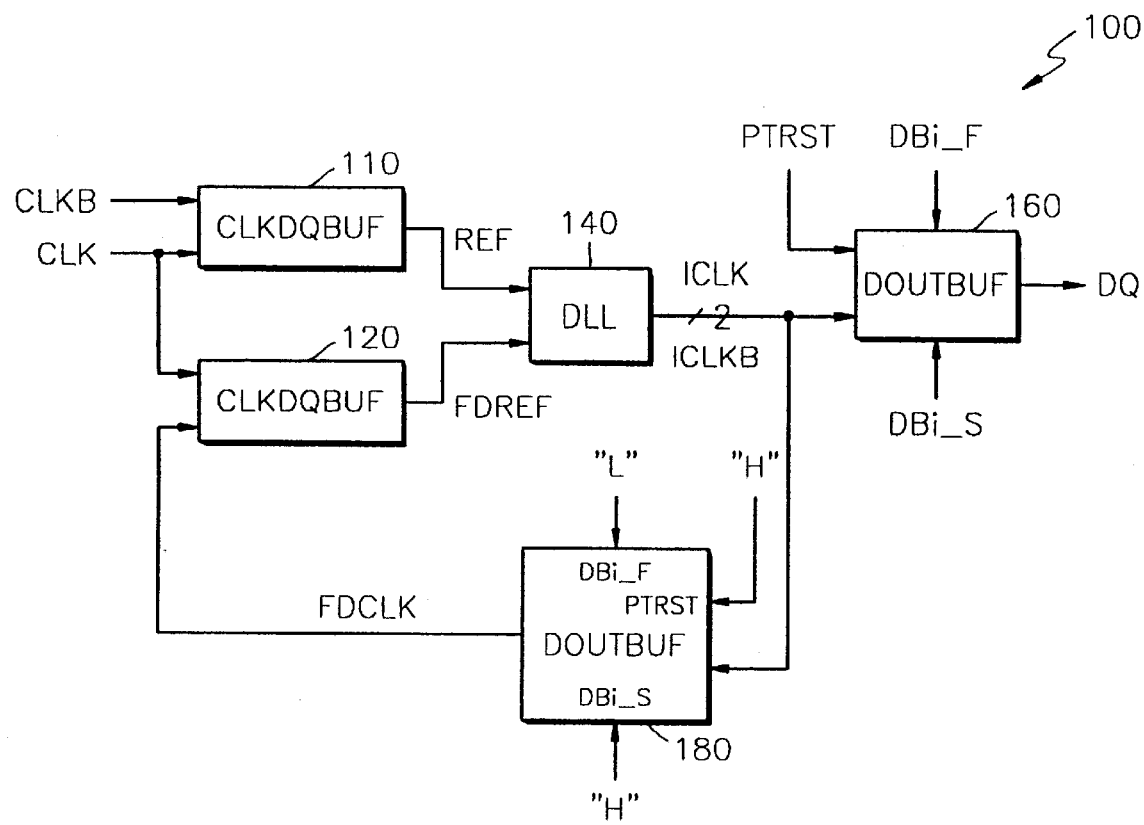
FIG. 1 is a block diagram showing a semiconductor memory device including a conventional delay locked loop (DLL)

The present invention will now be described more fully with reference to the accompanying drawings, in which preferred embodiments of the invention are shown. The same reference numerals appearing in different drawings represent similar elements.

Figure 3:
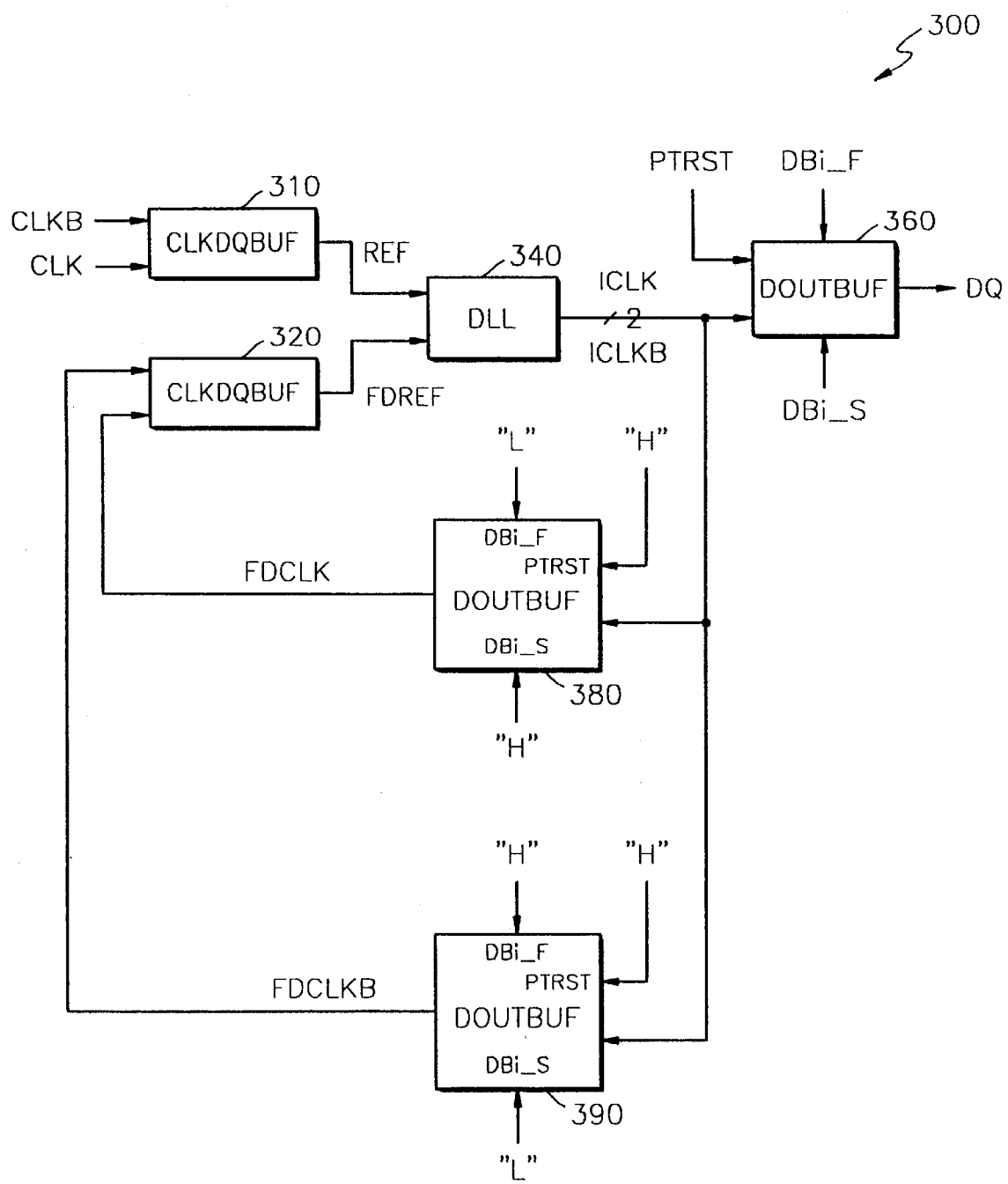
FIG. 3 is a block diagram showing a semiconductor memory device including a DLL according to a preferred embodiment of the present invention.

Referring to FIG. 3, a semiconductor memory device 300 according to an embodiment of the present invention generates internal clock signals ICLK and ICLKB which are synchronized with a received external clock signal CLK and its complementary signal CLKB, respectively. To this end, the semiconductor memory device 300 includes first and second input clock buffers 310 and 320, a delay locked loop (DLL) 340, an output buffer 360, and first and second feedback clock buffers 380 and 390.

Figure 2:
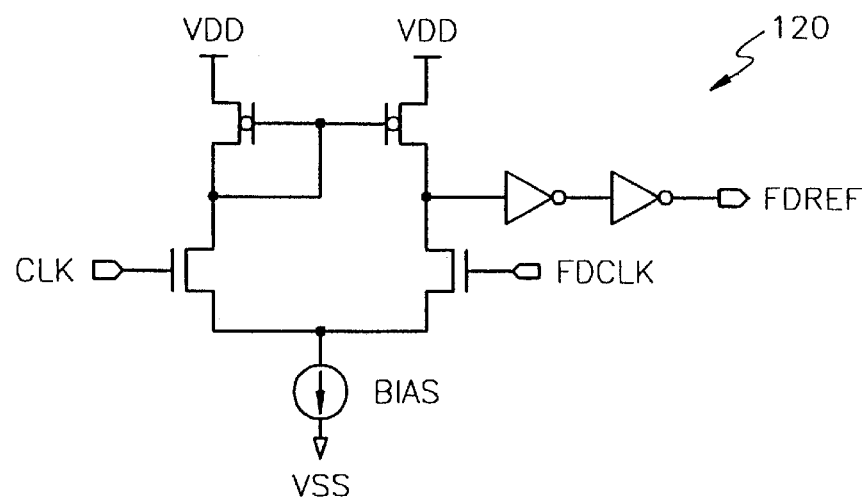
FIG. 2 is a circuit diagram showing the input clock buffer of FIG. 1.

The first input clock buffer 310 receives the external clock signals CLK and CLKB and generates a reference signal REF. The external clock signals CLK and CLKB are complementary clock signals having an opposite phase. The first input clock buffer 310 is comprised of a differential input buffer as shown in FIG. 2. The operation of the differential input buffer will now be described with reference to FIG. 4.

Figure 4:
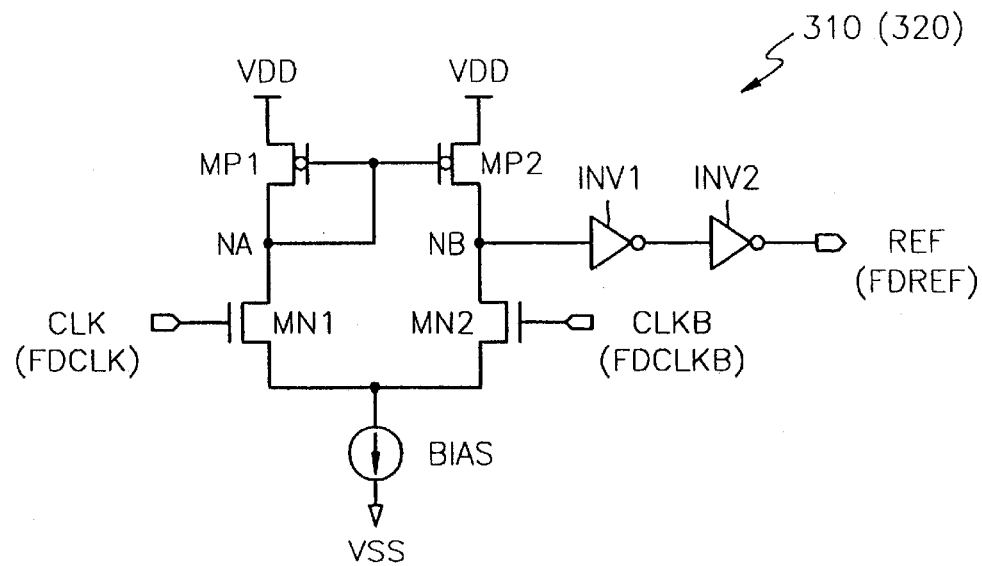
FIG. 4 is a circuit diagram showing the input clock buffer of FIG. 3.

Like a typical differential input buffer, the first input clock buffer 310 of FIG. 4 includes a current mirror, which is implemented as first and second PMOS transistors MP1 and MP2. The first input clock buffer 310 also includes first and second NMOS transistors MN1 and MN2 which are connected to the first and second PMOS transistors MP1 and MP2, respectively, and which are controlled by the external clock signals CLK and CLKB, respectively, and a current source BIAS for activating the operation of the differential input buffer. When the current source BIAS is enabled, the current level flowing through the first and second PMOS transistors MP1 and MP2 is constant. The first and second NMOS transistors MN1 and. MN2 have different loads depending on the voltage level, i.e., the logic level, of the external clock signals CLK and CLKB. Thus, a difference in a voltage level between nodes NA and NB occurs.

If the external clock signal CLK is at a logic high level and the external clock signal CLKB is at a logic low level, then the node NB becomes high. On the other hand, if the external clock signal CLK is at a logic low level and the external clock signal CLKB is at a logic high level, then the node NB becomes low. Thereafter, a signal at the node NB is output as a reference clock signal REF through two inverters INV1 and INV2. Thus, the reference signal REF is generated at a logic low level in response to the logic low level of the clock signal CLK, while the reference signal REF is generated at a logic high level in response to the logic high level of the clock signal CLKB. This complies with a typical buffer operation during which an output signal is generated at the same logic level as an input signal. Furthermore, since the clock signals CLK and CLKB are of complementary phases, the first input clock buffer 310 can implement a high-speed operation.

Returning to FIG. 3, the second input clock buffer 320 receives feedback clock signals FDCLK and FDCLKB to generate a feedback reference clock signal FDREF. The feedback clock signals FDCLK and FDCLKB are provided from the first and second feedback clock buffers 380 and 390, respectively, which will be described below, and these signals are also complementary clock signals. The second input clock buffer 320 is implemented as a differential input buffer, as the first input clock buffer 310 of FIG. 4. The DLL 340 receives a reference clock signal REF and a feedback reference clock signal FDREF, and senses a phase difference therebetween to generate internal clock signals ICLK and ICLKB. To this end, the DLL 340 may be realized as a DLL disclosed in U.S. Pat. No. 5,712,884 filed by the applicant of this invention and incorporated herein by reference, which pertains to eliminating a timing skew between an input clock signal and input data. For application to the operation of the DLL 340 according to the present invention, the input clock signal and the input data in the DLL disclosed in the '884 patent may be replaced with the reference clock signal REF and the feedback reference clock signal FDREF, respectively. Thus, the DLL 340 delays the feedback reference clock signal FDREF by a predetermined amount of time, i.e., a phase difference between the reference clock signal REF and the feedback reference clock signal FDREF, to generate the internal clock signals ICLK and ICLKB. In this case, if the phase difference between the reference clock signal REF and the feedback reference clock signal FDREF is zero, the DLL 340 performs a phase locking operation. Since the reference clock signal REF is derived from the external clock signal CLK, the internal clock signal ICLK, which is phase synchronous with the reference signal REF, is also phase synchronous with the external clock signal CLK.

Figure 5:
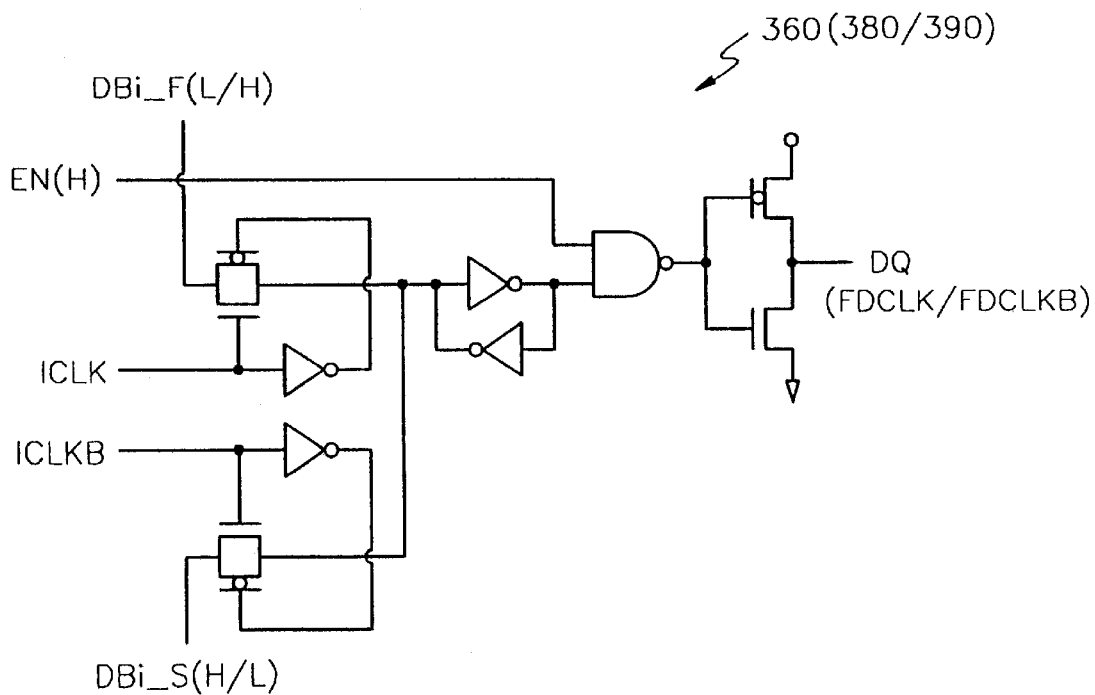
FIG. 5 is a circuit diagram showing the output buffer and the first and second feedback clock buffers of FIG. 3.

Internal clock signals ICLK and ICLKB are used as an actual clock signal for data receipt or data transmission. For example, the output buffer 360 transmits internal data DBi_F and DBi_S to the output pad DQ in response to the internal clock signals ICK and ICKB. Furthermore, the internal clock signals ICLK and ICLKB are used as a clock signal for synchronizing operations of circuit blocks provided within the semiconductor memory device. The output buffer 360 is schematically shown in FIG. 5. Referring to FIG. 5, the output buffer 360 outputs internal data DBi_F and DBi_S to the output pad DQ in response to the internal clock signals ICLK and ICLKB and an enable signal EN. When the enable signal EN is activated to a logic high level, first internal data DBi_F is transmitted to the output pad DQ in response to the rising edge of the internal clock signal ICLK, and second internal data DBi_S is transmitted to the output pad DQ in response to the rising edge of the inverted internal clock signal ICLKB. Here, the first and second internal data DBi_F and DBi_S correspond to data of memory cells arrayed within the semiconductor memory device.

With reference to FIG. 3, the internal clock signals ICLK and ICLKB are input to the first and second feedback clock buffers 380 and 390. The first feedback clock buffer 380 is substantially the same as the output buffer 360. The only difference is that the first and second internal data DBi_F and DBi_S are connected to a logic low level and a logic high level, respectively. Thus, both first and second feedback clock buffers 380 and 390 are shown in FIG. 5, together with the output buffer 360. The first feedback clock buffer 380 generates a first feedback clock signal FDCLK at a logic high level in response to the rising edge of the internal clock signal ICLK, and generates the first feedback clock signal FDCLK at a logic low level in response to the rising edge of the inverted internal clock signal ICLKB. Thus, the first feedback clock buffer 380 generates the first feedback clock signal FDCLK of the same phase as the internal clock signal ICLK. The second feedback clock buffer 390 is also substantially the same as the output buffer 360 of FIG. 5. The only difference is that the first and second internal data DBi_F and DBi_S are connected to a logic high level and a logic low level, respectively. The second feedback clock buffer 390 generates a second feedback clock signal FDCLKB at a logic low level in response to the. rising edge of the internal clock signal ICLK, and generates the second feedback clock signal FDCLK at a logic low level in response to the rising edge of the inverted internal clock signal ICLKB. Thus, the second feedback clock buffer 390 generates the second feedback clock signal FDCLKB at an opposite phase to that of the internal clock signal ICLK.

The first and second feedback clock signals FDCLK and FDCLKB generated by the first and second feedback clock buffers 380 and 390 have a complementary phase. Thereafter, those signals are input to the second input clock buffer 320 to generate a feedback reference signal FDREF. This is suitable for a high-speed operation of the second input clock buffer 320 which is the differential input buffer described above.

Accordingly, in the semiconductor memory device according to the present invention, input signals of the second input clock buffer 320 for generating a feedback reference clock signal FDREF input to the DLL 340 are of complementary phase. Thus, high speed operation of the second input clock buffer 320 comprised of a differential input buffer can be achieved. Furthermore, since the feedback reference clock signal FDREF output by a high-speed operation of the second input clock buffer 320 are received to the DLL 340, the DLL 340 also can provide for a high-speed operation without a delay in comparing the reference clock signal REF with the feedback reference clock signal FDREF.

Although the invention has been described with reference to a particular embodiment, the illustrated embodiment is only an example, and it should be understood by those skilled in the art that various changes in form and details may be made therein without departing from the spirit and scope of the invention as defined by the appended claims.

What is claimed is:

1. A semiconductor memory device for generating internal clock signals synchronized with external clock signals, the semiconductor memory device comprising:

a first input clock buffer which receives a pair of external clock signals and generates a reference clock signal;

a delay locked loop which receives the reference clock signal and a feedback reference clock signal, compares respective phases of the reference clock signal and the feedback reference clock signal, and generates a pair of internal clock signals;

a first feedback clock buffer which receives the pair of internal clock signals and generates a first feedback clock signal;

a second feedback clock buffer which receives the pair of internal clock signals and generates a second feedback clock signal; and a second input clock buffer which receives the first and second feedback clock signals and generates the feedback reference clock signal.

2. The semiconductor memory device of claim 1, wherein the first and second feedback clock signals are complementary.

3. The semiconductor memory device of claim 1, wherein the first input clock buffer is a differential input buffer for sense-amplifying a voltage level difference between the pair of external clock signals and for generating the reference clock signal.

4. The semiconductor memory device of claim 1, wherein the second input clock buffer is a differential input buffer for sense-amplifying a voltage level difference between the first and second feedback clock signals and for generating the feedback reference clock signal.

5. The semiconductor memory device of claim 1, wherein the first feedback clock buffer receives the pair of internal clock signals and generates the first feedback clock signal having the same phase as the internal clock signals.

6. The semiconductor memory device of claim 1, wherein the second feedback clock buffer receives the pair of internal clock signals and generates the second feedback clock signal having opposite phase to the internal clock signals.

7. The semiconductor memory device of claim 1, further comprising an output buffer for outputting internal data of the semiconductor memory device in response to the pair of internal clock signals.

* * * * *